United States Patent
Hiratsuka

(10) Patent No.: US 7,897,422 B2
(45) Date of Patent: Mar. 1, 2011

(54) SEMICONDUCTOR LIGHT-EMITTING DEVICE AND A METHOD TO PRODUCE THE SAME

(75) Inventor: Kenji Hiratsuka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 417 days.

(21) Appl. No.: 12/081,865

(22) Filed: Apr. 22, 2008

(65) Prior Publication Data
US 2008/0290358 A1 Nov. 27, 2008

(30) Foreign Application Priority Data
Apr. 23, 2007 (JP) .............. 2007-113389

(51) Int. Cl.
*H01L 21/00* (2006.01)
*H01L 31/0232* (2006.01)
(52) U.S. Cl. ............... 438/41; 438/31; 438/39; 438/40; 438/46; 438/47; 257/94; 257/96; 257/98; 257/101; 257/E21.11; 257/E21.111; 257/E21.449; 257/E31.118; 257/E33.023; 257/E33.029; 372/45.01; 372/46.01
(58) Field of Classification Search .............. 438/31, 438/39, 40, 46, 47; 257/94, 96, 98, 101, 257/E21.11, E21.111, E21.449, E31.118, 257/E33.023, E33.029; 372/45.01, 46.01
See application file for complete search history.

(56) References Cited

U.S. PATENT DOCUMENTS

| 5,717,710 A | * | 2/1998 | Miyazaki et al. ......... 372/50.11 |
| 6,664,605 B1 | * | 12/2003 | Akulova et al. ............. 257/432 |
| 7,087,449 B2 | * | 8/2006 | Kish et al. .................... 438/41 |
| 2005/0151144 A1 | * | 7/2005 | Kish et al. .................... 257/94 |

FOREIGN PATENT DOCUMENTS

| JP | 7-254750 | 10/1995 |
| JP | 11-238942 | 8/1999 |

* cited by examiner

*Primary Examiner*—Dao H Nguyen
(74) *Attorney, Agent, or Firm*—Smith, Gambrell & Russell, LLP

(57) ABSTRACT

A new structure of a semiconductor optical device and a method to produce the device are disclosed. One embodiment of the optical device of the invention provides a blocking region including, from the side close to the mesa, a p-type first layer and a p-type second layer. The first layer is co-doped with an n-type impurity and a p-type impurity. The doping concentration of the p-type impurity in the first layer is smaller than that in the second layer, so, the first layer performs a function of a buffer layer for the Zn diffusion from the second layer to the active layer in the mesa structure.

11 Claims, 10 Drawing Sheets

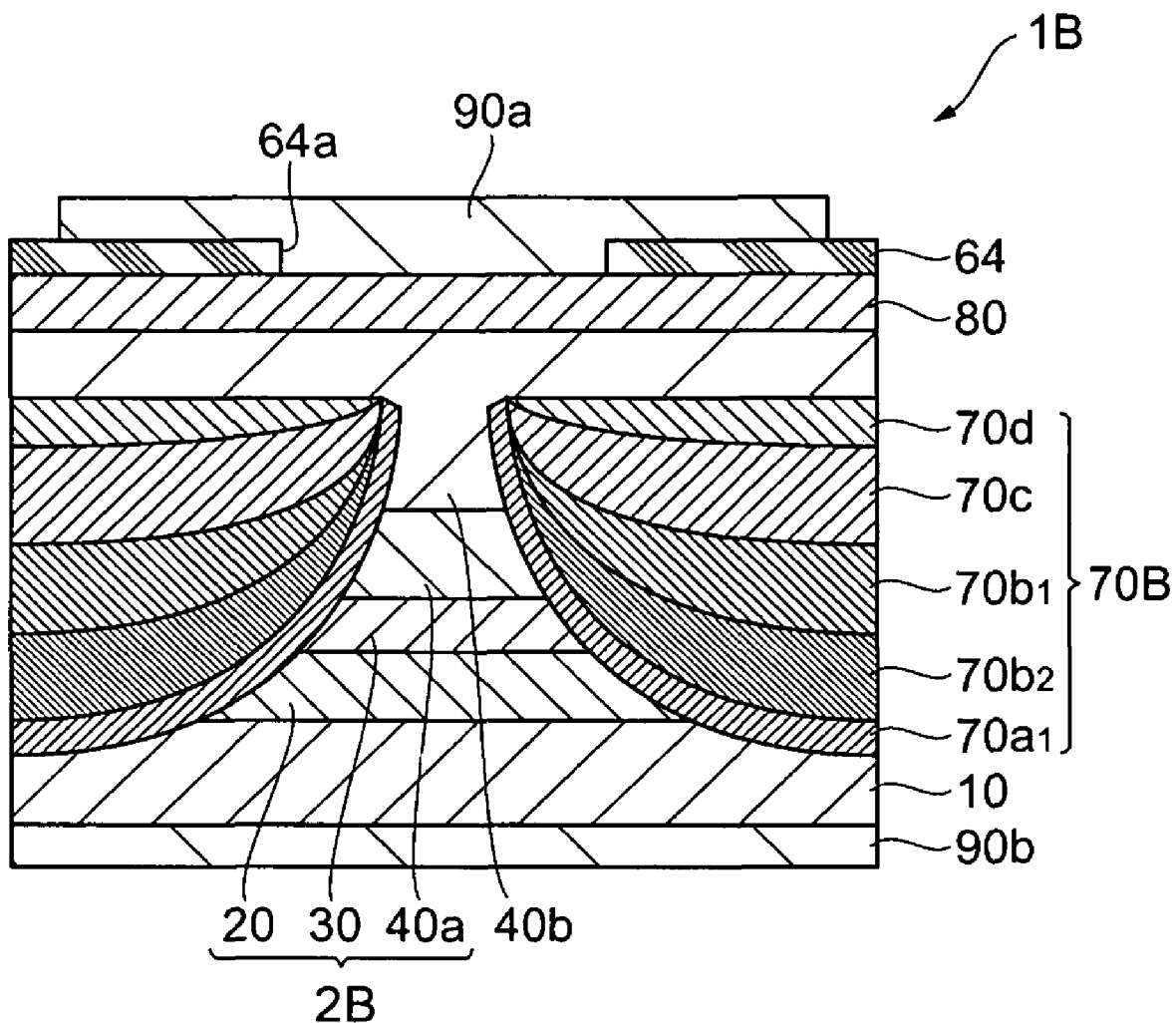

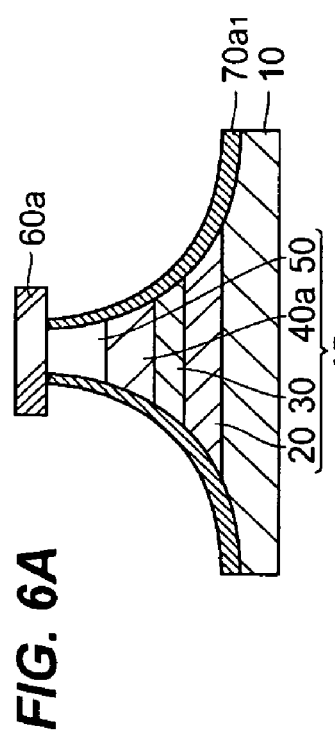
FIG. 6A
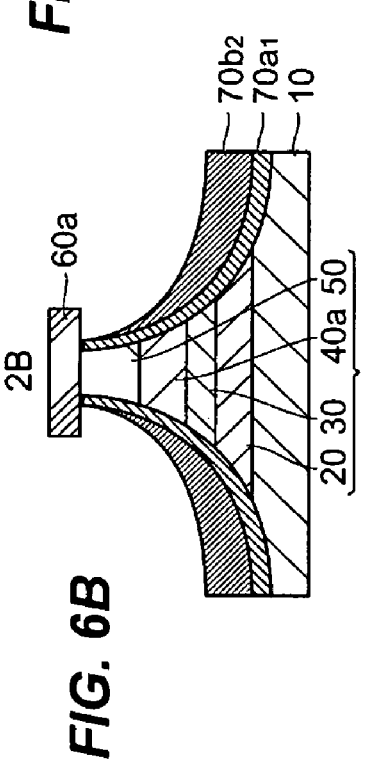
FIG. 6B
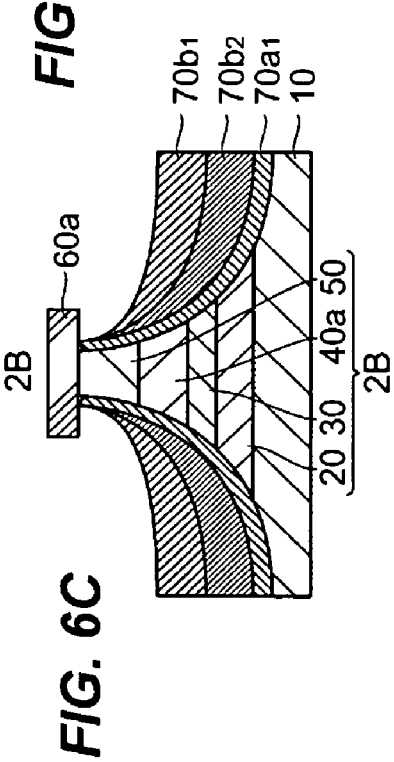
FIG. 6C
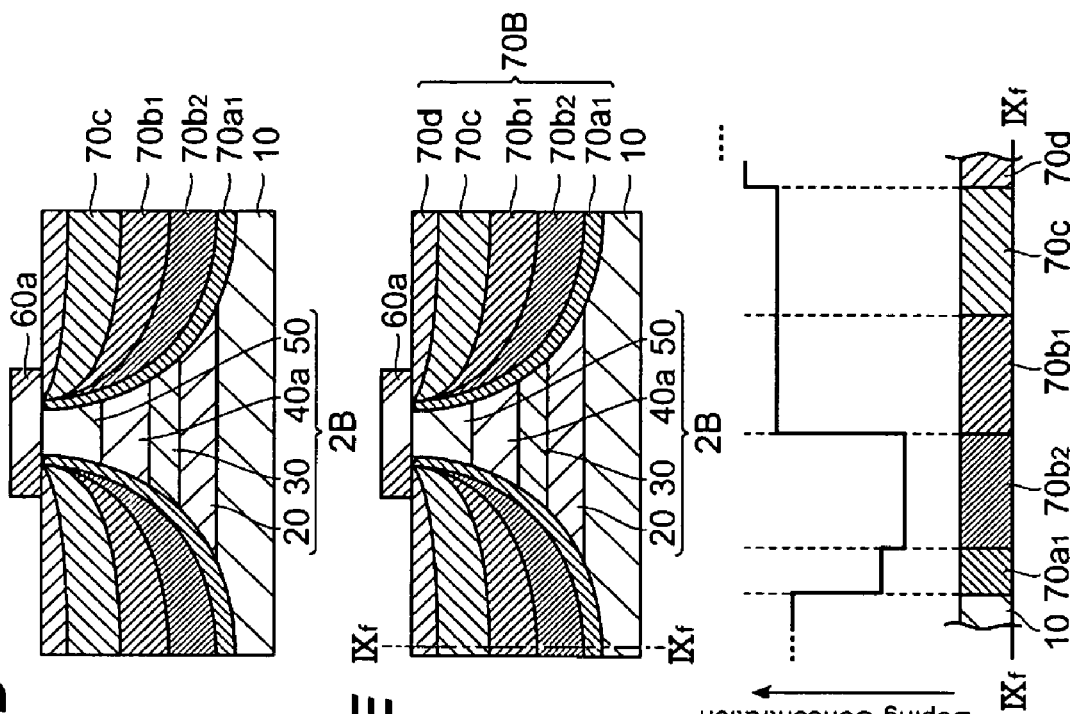
FIG. 6D
FIG. 6E
FIG. 6F

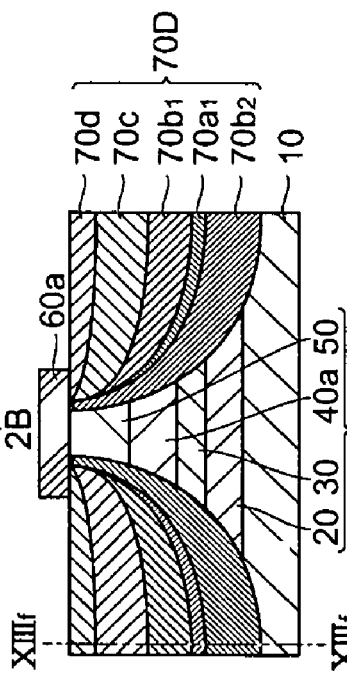
FIG. 10D
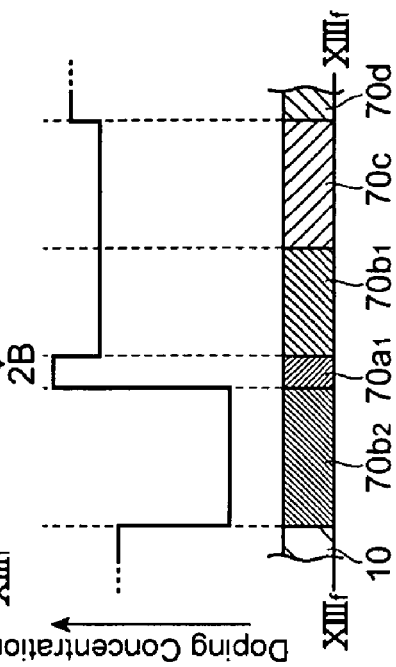
FIG. 10E
FIG. 10F
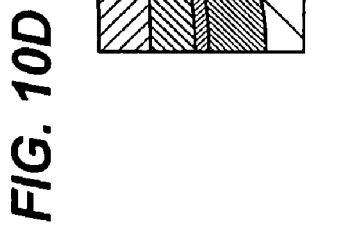
FIG. 10A
FIG. 10B
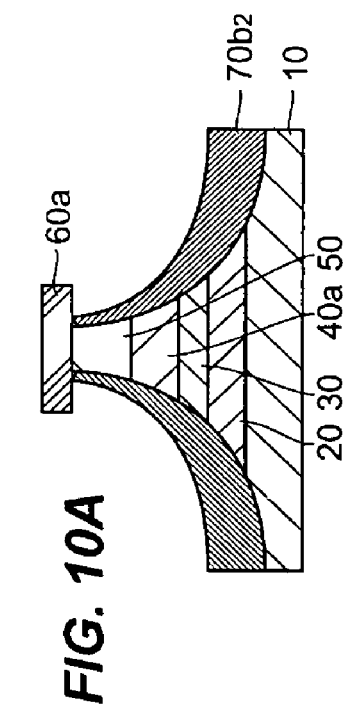
FIG. 10C

SEMICONDUCTOR LIGHT-EMITTING DEVICE AND A METHOD TO PRODUCE THE SAME

BACKGROUND OF THE INVENTION

1. Field of the Invention

The present invention relates to a structure of a semiconductor optical device, and a method for producing the semiconductor optical device.

2. Related Prior Art

A semiconductor optical device, in particular, the semiconductor layer diode generally provides a buried mesa structure to reduce the threshold current. However, when the doping concentration in layers coming in contact with the side walls of the mesa is high, the impurities contained in the layers neighbor to the mesa may diffuse into the active layer in the mesa, which degrades the quality of the device, especially, the light emitting efficiency of the laser diode. Japanese Patent Applications published as H11-238942A and H07-254750A have disclosed semiconductor light-emitting devices with a structure where the inner layer and the outer layer in the buried region have different doping concentration of zinc (Zn) to suppress the Zn diffusion into the active layer.

However, because of the large diffusion co-efficient of Zn, it is quite difficult to prevent the invasion of Zn on the active layer completely. The present invention is to provide a new structure of the semiconductor optical device to prevent the Zn diffusion into the active layer effectively and a method to produce the device.

SUMMARY OF THE INVENTION

One aspect of the present invention relates to a method for manufacturing a semiconductor optical device. The method comprises steps of; (a) forming a mesa on a semiconductor substrate, said mesa including a lower cladding layer, an active layer, and an upper cladding layer; (b) forming a blocking region so as to bury said mesa by a sequential growth including, (b-1) growing a first semiconductor layer made of InP doped with n-type impurities at least on a side wall of said active layer in said mesa, (b-2) growing a second semiconductor layer on said first semiconductor layer, said second semiconductor layer being made of p-type InP doped with zinc (Zn), and (b-3) growing a third semiconductor layer made of n-Type InP doped with n-type impurities; and (c) converting said first semiconductor layer into a p-type semiconductor layer by heat treatment.

The method of the invention has a feature that it includes a step to dope the first semiconductor layer with an n-type impurities, accordingly, the first semiconductor layer may trap Zn impurities diffused from the second semiconductor layer into the active layer in the mesa. Moreover, this first semiconductor layer may be converted into a p-type layer by the diffused Zn atoms during the subsequent thermal process, which forms the p-n junction in the blocking region and this p-n junction, by reversely biased in the normal operating condition of the optical device, may suppress the leak current flowing the blocking region. Thus, the existence of the first semiconductor layer converted into the p-type layer may enhance the long-term reliability of the device.

The doping concentration of the n-type impurities in the first semiconductor layer is preferably higher than the doping concentration of Zn atoms in the second semiconductor layer, which effectively traps the Zn atoms diffused from the second semiconductor layer into the active layer.

The method may further provide a step for growing a first additional layer after the step of growing the first semiconductor layer before the step of growing the second semiconductor layer. The first additional semiconductor layer may be made of n-type InP doped with Zn whose concentration is smaller than that in the second semiconductor layer, or made of un-doped InP. This first additional semiconductor layer, collectively with the first semiconductor layer, may enhance the trapping function for the Zn atoms diffused from the second semiconductor layer into the first semiconductor layer.

The method may further provide a step for growing a second additional layer after the step of growing the first additional semiconductor layer before the step of growing the second semiconductor layer. The second additional semiconductor layer may be InP doped with n-type impurities and be converted in a p-type layer during the subsequent thermal process for the device. This second additional semiconductor layer may further enhance the trapping effect for the Zn atoms diffused from the second semiconductor layer into the active layer.

A second method of the present invention has a feature that it provides a step, after the formation of the mesa before the growth of the first semiconductor layer, of growing an additional semiconductor layer made of InP. This first additional semiconductor layer may be un-doped InP or n-type InP doped with Zn whose doping concentration is preferably lower than a doping concentration of Zn in the second semiconductor layer.

Because the second method includes the step to form the first additional semiconductor layer with the p-type conduction first in the blocking region, which shows the high resistivity, the leak current along the side wall of the mesa may be suppressed. Moreover, the diffused Zn atoms from the second semiconductor layer may be trapped by the first semiconductor layer, which enhances the long-term reliability of the device.

The doping concentration in the first additional semiconductor layer may be lower than that in the second semiconductor layer, which enhances the function of the first additional semiconductor layer to trap Zn atoms diffused from the second semiconductor layer into the active layer. Also, the doping concentration of the n-type impurities in the first semiconductor layer may be higher than the doping concentration of Zn atoms in the second semiconductor layer.

Another aspect of the present invention relates to a layer configuration of a semiconductor optical device. The optical device comprises a mesa and a blocking region both on a semiconductor substrate. The mesa includes a lower cladding layer, an active layer and an upper cladding layer. The blocking region buries the mesa and includes a stacked arrangement of first to third semiconductor layers. The first semiconductor layer is made of InP co-doped with n-type impurities and Zn atoms, and covers at least a side wall of the active layer. The second semiconductor layer is p-type InP doped with Zn, while, the third semiconductor layer is n-type InP. The doping concentration of Zn atoms in the first semiconductor layer is lower than the doping concentration of Zn atoms in the second semiconductor layer.

Although the first semiconductor layer shows the p-type conduction, the first semiconductor layer contains the n-type impurities, which effectively traps the Zn atoms diffused from the second semiconductor layer into the active layer. Moreover, the p-type first semiconductor layer may show the high resistivity, which effectively suppresses the leak current flowing along the side wall of the mesa.

BRIEF DESCRIPTION OF DRAWINGS

FIG. 5 schematically illustrates a cross section of a semiconductor optical device according to the second embodiment of the invention, where the blocking region of the device includes, in addition to those shown in FIG. 1, a second additional layer $70a_2$ between the first additional layer $70b_2$ and the second layer $70b_1$;

FIGS. 6A to 6E show processes to form the blocking region shown in FIG. 5, and FIG. 6F shows a doping profile of the blocking region;

FIGS. 10A to 10F show processes to form the blocking region shown in FIG. 9, and FIG. 7F illustrates the doping profile of the blocking region.

DESCRIPTION OF PREFERRED EMBODIMENTS

Next, preferred embodiments of the manufacturing process of the semiconductor optical device according to the present invention will be described as referring to accompanying drawings. In the description of drawings, the same numerals or the symbols will refer to the same elements without overlapping explanations.

First Embodiment

Figure 1:
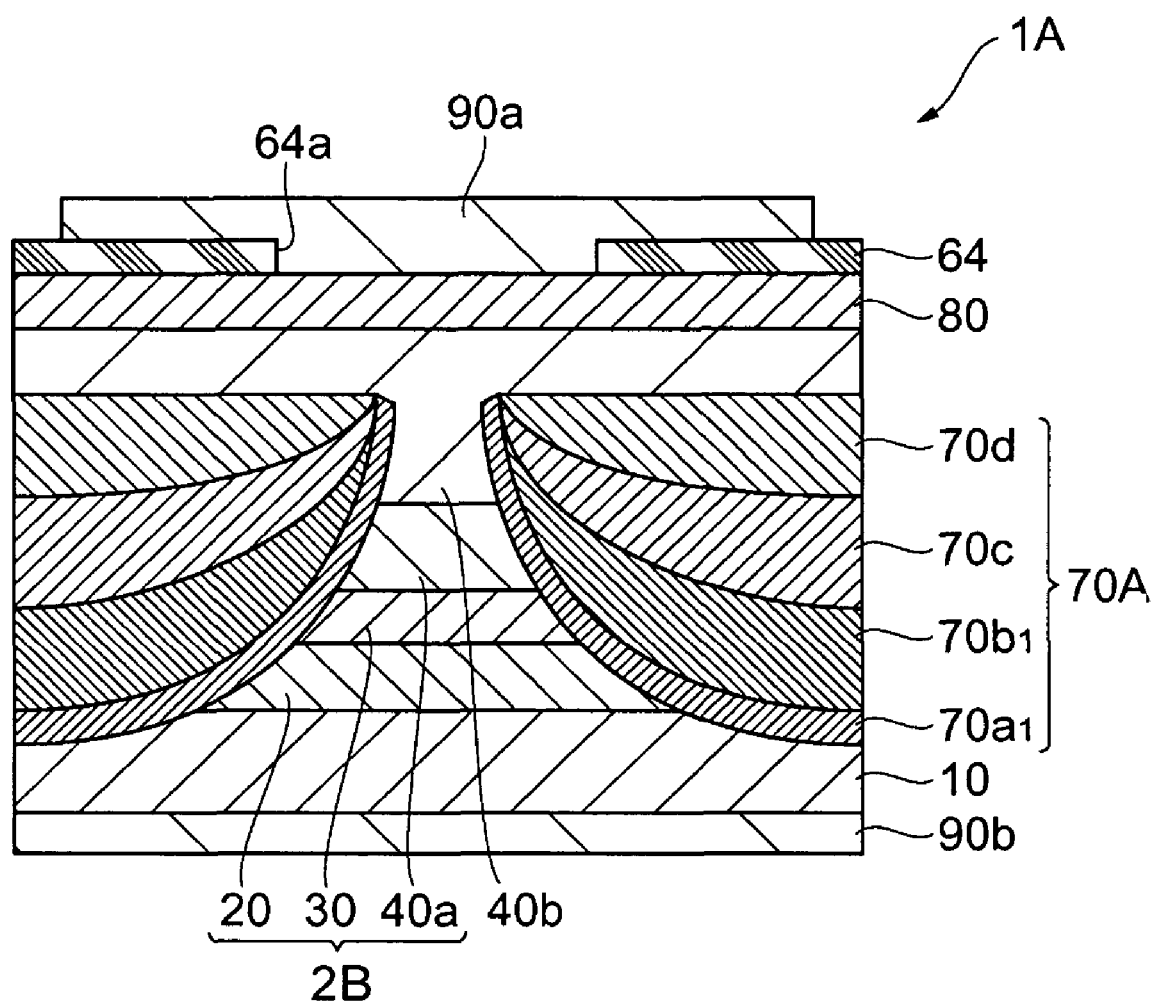
FIG. 1 schematically illustrates a cross section of a semiconductor optical device according to the first embodiment of the invention.

FIG. 1 schematically illustrates a cross section of a semiconductor optical device 1A according to the first embodiment of the invention. The semiconductor optical device 1A may be a semiconductor laser diode. As shown in FIG. 1, the device 1A provides a mesa 2B containing an active layer 30 and a blocking region 70A to bury the mesa 2B each formed on a semiconductor substrate 10.

The substrate 10 is an InP substrate with the first conduction type, for instance, the n-type InP, and has a thickness of about 350 μm and a carrier density of about $1 \times 10^{18}$ cm$^{-3}$.

The mesa 2B includes a lower cladding layer 20 with the first conduction type, the active layer 30, and an first upper cladding layer 40A with the second conduction type. The active layer 30 may have a multiple quantum well structure with a plurality of well layers and barrier layers stacked alternately to each other. The well layers and the barrier layers may be made of GaInAsP with compositions different from each other. The thickness of the active layer 30 is 0.23 μm. The lower cladding layer 20 is the n-type InP with a thickness of 0.55 μm and the carrier density of about $8 \times 10^{17}$ cm$^{-3}$. The first upper cladding layer 40A is the p-type InP with a thickness of about 0.44 μm and a carrier density of about $8 \times 10^{17}$ cm$^{-3}$.

The blocking region 70A includes a stack of layers comprising, from the side of the mesa 2B, a first layer $70a_1$ with the p-type conduction, a second layer $70b_1$ with the p-type conduction, a third layer $70c$ with the n-type conduction and a fourth layer $70d$ with the p-type conduction.

The first layer $70a_1$ may be InP doped with n-type impurities such as silicon (Si) and also p-type impurities such as zinc (Zn). The concentration of the n-type impurities is, for example, 0.9 to $1.31 \times 10^{18}$ cm$^{-3}$, while, that of the p-type impurities is, for example, 0.7 to $1.1 \times 10^{18}$ cm$^{-3}$. The thickness of the first layer $70a_1$ may be about 0.1 μm.

The second layer $70b_1$ may be a p-type InP doped with Zn by the concentration of 0.7 to $1.1 \times 10^{18}$ cm$^{-3}$, and a thickness is about 0.90 μm. The third layer $70c$ is an n-type InP with a concentration of 1.8 to $2.3 \times 10^{18}$ cm$^{-3}$ and a thickness of about 1.0 μm. The fourth layer $70d$ is a p-type InP with a concentration of 0.7 to $1.8 \times 10^{18}$ cm$^{-3}$ and a thickness of 0.1 μm.

The device 1A further provides a second upper cladding layer $40b$ with the second conduction type, a contact layer 80 and an insulating layer 64. These layers are formed so as to cover the mesa 2B and the blocking region 70A. The second upper cladding layer $40b$, which forms a portion of the mesa 2B, is provided on the first upper cladding layer 40A in the mesa 2B and the p-fourth layer $70d$ with the p-type conduction. This second upper cladding layer $40b$ is a p-type InP doped with p-type impurities by a concentration of $8 \times 10^{17}$ cm$^{-3}$. The contact layer 80 may be a p-type InGaAs with an impurity concentration of $1.5 \times 10^{19}$ cm$^{-3}$ and a thickness of about 0.52 μm. The insulating layer 64 may be an organic material containing silicon (Si) such as silicon die-oxide (SiO$_2$) and silicon nitride (SiN). A thickness of this insulating layer 64 may be about 0.3 μm.

The device 1A may further provides an electrode $90a$, for instance, an anode electrode of the device, formed so as to cover the insulating layer 64 and the contact layer 80 exposed in an opening $64a$ of the insulating layer 64.

The device 1A thus described has the first layer $70a_1$ in the blocking region 70A that contains the n-type impurities, which restricts the diffusion of zinc atoms from the second layer $70b_1$ to the active layer 30. Moreover, the first layer $70a_1$ shows the p-type conduction and the high resistivity, which restricts the leak current at the side edges of the mesa 2B. Thus, the first layer $70a_1$ enhances the long-term reliability of the semiconductor device 1A.

FIGS. 2 to 7 schematically explain a process to form the semiconductor device 1A of the present embodiment.

Growth of Semiconductor Layers

Figure 2A:
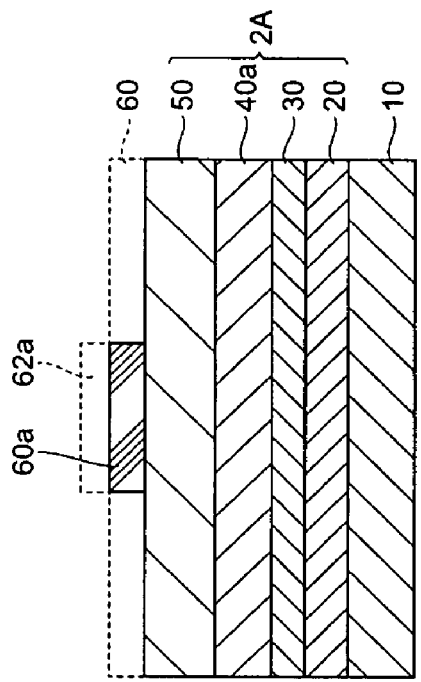
FIGS. 2A to 2D show processes to manufacture the semiconductor optical device shown in FIG. 1.

First, the process sequentially grows the semiconductor layers 2A by the organic metal chemical vapor deposition (OMVPE) method on the substrate 10 with the first conduction type (FIG. 2A). The layers 2A includes the lower cladding layer 20 with the first conduction type, the active layer 30, the cladding layer 40A with the second conduction type and the cap layer 50 with the second conduction type.

The table below exemplarily lists the conditions of these layers:

| Conditions of semiconductor layers I | |
|---|---|
| Layer | Conditions |
| Substrate 10 | n-type InP<br>[n]: $1 \times 10^{18}$ cm$^{-3}$<br>t: 350 μm |
| lower cladding layer 20 | n-type InP<br>[n]: $8 \times 10^{17}$ cm$^{-3}$<br>t: 0.55 μm |
| upper cladding layer 40A | p-type InP<br>[p]: $8 \times 10^{17}$ cm$^{-3}$<br>t: 0.44 μm |
| cap layer 50 | p-type InGaAs<br>[p]: $2 \times 10^{17}$ cm$^{-3}$<br>t: 0.44 μm | where [n] and [p] means the carrier concentration of the negative and the positive carriers, respectively, and t is the thickness.

Deposition of Insulating Layer

Next, on the cap layer 50 is formed with the insulating layer 60 by, for example, the chemical vapor deposition (CVD) technique. This insulating layer may be made of silicon nitride (SiN) or silicon die-oxide (SiO$_2$).

Patterning of Insulating Layer

Figure 2C:
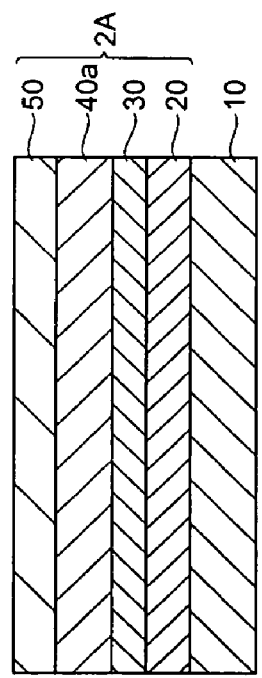
Figure 2B:
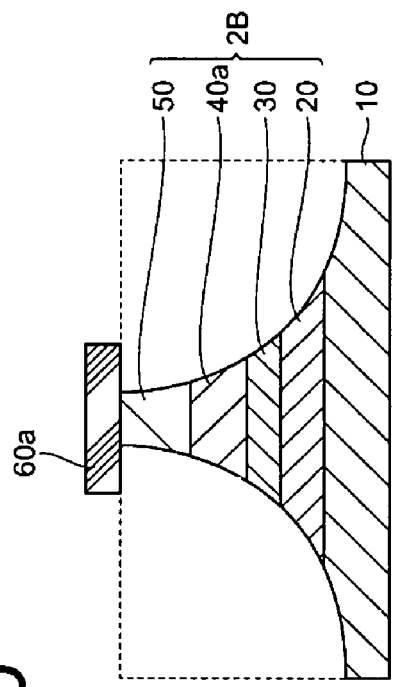

The insulating layer 60 is patterned to form a stripe 60a extending along a predetermined direction. Specifically, as shown in FIGS. 2B and 2C, a photo resist film is first coated on the insulating layer 60. This photo resist film is exposed by the lithography with the stripe pattern, then developed to from a photo resist pattern 62a on the insulating layer 60. Subsequently, the process etches the insulating layer not covered by this photo resist pattern to expose the cap layer 50. The photo resist pattern 62a is removed after the completion of the etching.

Formation of Mesa Structure

Figure 2D:
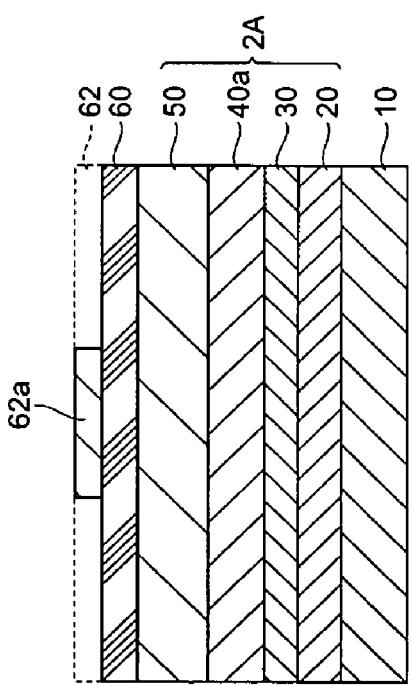

Next, the process forms the mesa structure 2B as shown in FIG. 2D. This mesa structure 2B may be formed by the etching of the stack 2A of the layers by the striped insulating pattern 60a as the etching mask. The etching is carrier out until the semiconductor substrate 10 exposes. In the present embodiment, the etching is carried out by, what is called, the wet-etching using a solution containing methanol bromide. The dry-etching using the reactive ion etching: RIE) technique may be applicable. Thus, the etching forms the mesa 2B extending along the predetermined direction on the substrate 10.

Growth of Blocking Region

Figure 3A:
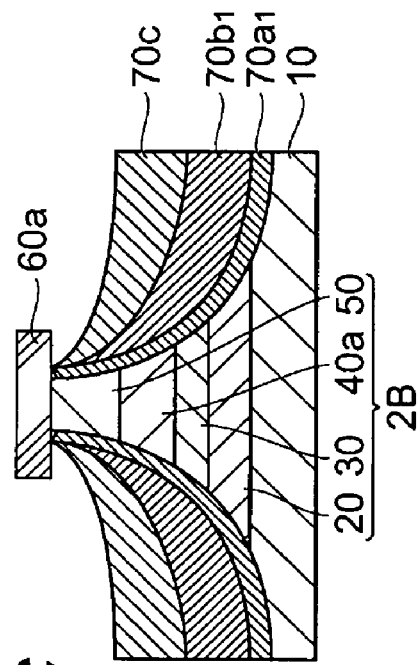
FIGS. 3A to 3D show processes subsequent to the process shown in FIG. 2D to manufacture the semiconductor optical device.
Figure 3C:
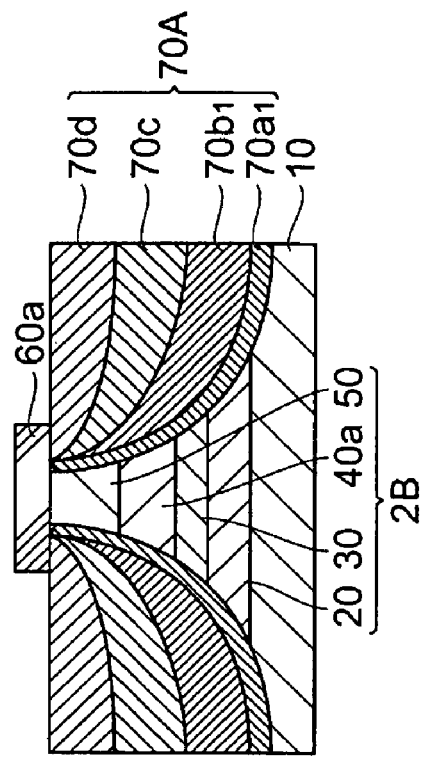
Figure 3B:
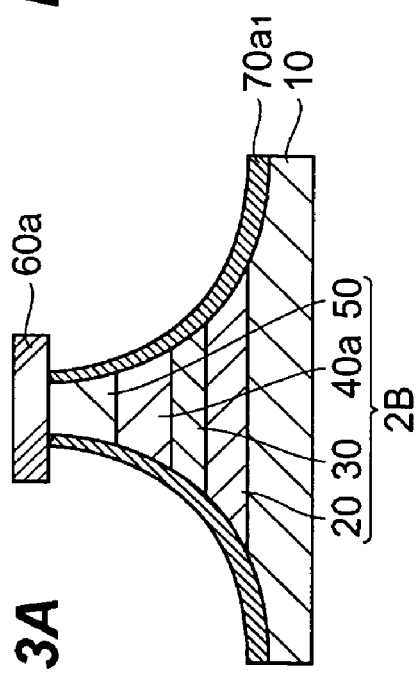
Figure 3D:
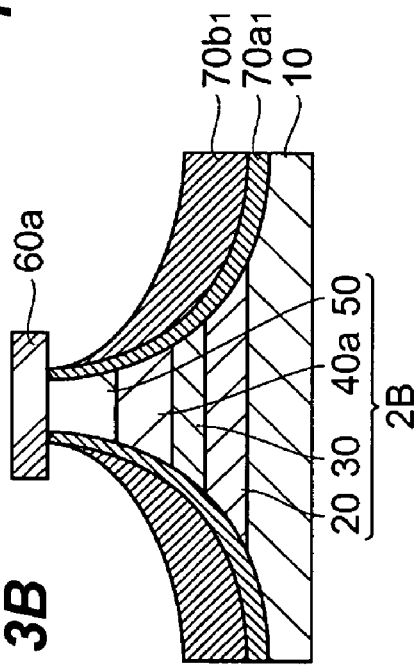

Subsequently, the blocking region 70A is grown to realize the current blocking function as shown in FIGS. 3A to 3D by the following processes:

(1) First growing the n-type first layer 70$a_1$ so as to cover the semiconductor substrate 10 and both side surfaces of the mesa 2B as illustrated in FIG. 3A, the first layer 70$a_1$ being co-doped with p-type impurities such as Zn, which makes the first layer high-resistive to suppress the leak current occurred at the both side surfaces of the mesa 2B;

(2) growing the p-type second layer 70$b_1$ on the first layer 70$a_1$;

(3) growing the n-type third layer 70c on this p-type second layer 70$b_1$ as shown in FIGS. 3B and 3C, respectively; and (4) growing the p-type fourth layer 70d on the n-type third layer 70c to complete the blocking region 70A in both sides of the mesa 2B.

In these layers, the p-type impurities may be Zn, while, the n-type impurities may be Si and the growth of them may be carried out by the OMVPE technique. The table below lists the exemplary conditions of these layers:

| Conditions of semiconductor layers II | |
|---|---|
| Layer | Conditions |
| p-type second layer 70$b_1$ | p-type InP<br>[p]: $0.7\sim1.1 \times 10^{18}$ cm$^{-3}$<br>t: 0.9 μm |
| n-type third layer 70c | n-type InP<br>[n]: $1.6\sim2.4 \times 10^{18}$ cm$^{-3}$<br>t: 1.0 μm |
| p-type fourth layer 70d | p-type InP<br>[p]: $0.7\sim1.1 \times 10^{18}$ cm$^{-3}$<br>t: 0.1 μm |

The striped insulating mask 60a is removed by, for example, a fluoric acid after the formation of the blocking region 70A. Next, the cap layer 50 is selectively removed by the wet-etching using a mixed solution of phosphoric acid and hydrogen peroxide. Thus, the process forms the mesa structure 2B including the lower cladding layer 20, the active layer 30, and the first upper cladding layer 40a.

Formation of Upper Cladding Layer and Contact Layer

Figure 4:
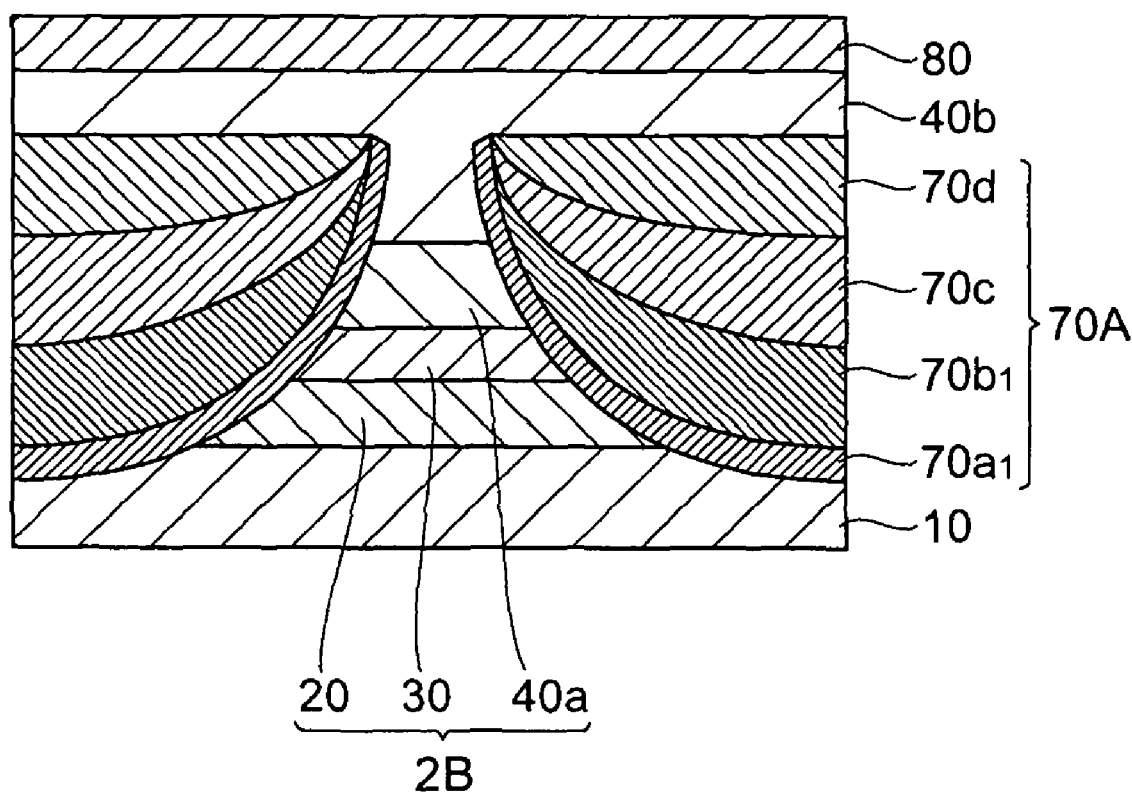
FIG. 4 shows a process subsequent to the process shown in FIG. 3D to manufacture the semiconductor optical device.

Next, the second upper cladding layer 40b with the second conduction type (p-type in the present embodiment) and the contact layer 80, also showing the second conduction type, are grow on the mesa 2B and on the fourth layer 70d as shown in FIG. 4. The table below lists exemplarily condition of these two layers:

| Conditions of semiconductor layers III | |
|---|---|
| Layer | Conditions |
| second upper cladding layer 40b | p-type InP<br>[p]: $1 \times 10^{18}$ cm$^{-3}$<br>t: 1.6 μm |
| contact layer 80 | p-type InGaAsP<br>[p]: $1.5 \times 10^{19}$ cm$^{-3}$<br>t: 0.5 μm |

These layers may be also grown by the OMVPE technique. The p-type impurities may be Zn. The growth of the blocking region 70A, the second upper cladding layer 40b and the contact layer 80 are carried out for one hour at a temperature between 620 to 680° C., which simultaneously performs the heat treatment of the device under processed. That is, during the holding of the device in a high temperature, the Zn impurities contained in the second layer 70$b_1$ may diffuse into the first layer 70$a_1$ to convert the conduction type of the first layer 70$a_1$ into the p-type.

Formation of Insulating Layer

Next, on the contact layer 80 is formed with an insulating layer by, for example, the CVD technique. This insulating layer may a silicon die-oxide or a silicon nitride. Then, this insulating layer 64 is processed to form a window 64a above the mesa 2B and extending along the predetermined direction identical with that of the mesa 2B.

The patterning of the insulating layer 64 may be carried out by a conventional technique using the photo-lithography and the etching. A width of the window 64a is preferably wider than a width of the mesa 2B as shown in FIG. 1. This insulating layer 64 restricts the injection path of the driving current for the device 1A.

Formation of Electrodes

Finally, an upper electrode 90a is formed on the insulating layer 64 and the contact layer 80 exposed in the window 64a. This upper electrode 90a corresponds to an anode of the device. A lower electrode 90b is deposited on the back surface of the substrate 10, which is a cathode electrode of the device. Prior to the formation of the lower electrode 90b, the substrate is preferably grinned to a thickness of about 100 μm by put it to a support silica glass. The electrodes, 90a and 90b, may be deposited by the evaporation. Thus, the device 1A is completed.

In the present embodiment, the device 1A provides the first layer $70a_1$ between the mesa 2B and the p-type second layer $70b_1$. This first layer $70a_1$ may prevent the p-type impurities, typically Zn, from diffusing from the second layer $70b_1$ to the active layer 30 during the subsequent thermal process.

The Zn diffusion from the second layer $70b_1$ converts the first layer $70a_1$ into the p-type, which makes the first layer $70a_1$ high-resistive and suppresses the leak current occurred at both side surfaces of the mesa 2B. The Zn diffusion into the first layer $70a_1$ makes the first layer $70a_1$ and the second layer $70b_1$ collectively to operate as a p-type layer. Consequently, the blocking region 70A forms a p-n-p structure to block the current flowing therethrough. Thus, the device 1A shows the long-term reliability because the first layer $70a_1$ prevents the Zn impurities form diffusing into the active layer and the preferable efficiency because the current is prevented from flowing except the mesa 2B by the blocking region 70A.

Second Embodiment

FIG. 5 schematically shows a cross section of a semiconductor optical device 1B according to a second embodiment of the invention. The device 1B may be a semiconductor laser diode and has a feature, compared to the device 1A of the first embodiment, that the device 1B provides another blocking region 70B. Other configurations are same with or similar to those in the former device 1A. The blocking region 70B provides a first additional layer $70b_2$ between the first layer $70a_1$ and the second layer $70b_1$.

The table below lists exemplarily condition of respective layers:

| Conditions of semiconductor layers IV | |
|---|---|
| Layer | Conditions |
| first layer $70a_1$ | p-type InP<br>t: 0.1 μm |
| first additional layer $70b_2$ | p-type InP<br>[p]: 0.2~0.6 × $10^{18}$ cm$^{-3}$<br>t: 0.2 μm |
| second layer $70b_1$ | p-type InP<br>[p]: 0.7~1.1 × $10^{18}$ cm$^{-3}$<br>t: 0.7 μm |
| third layer 70c | n-type InP<br>[n]: 1.6~2.4 × $10^{18}$ cm$^{-3}$<br>t: 1.0 μm |
| fourth layer 70d | p-type InP<br>[p]: 0.7~1.1 × $10^{18}$ cm$^{-3}$<br>t: 0.1 μm |

The blocking region 70B in the device 1B has an arrangement where the doping concentration of Zn in the first additional layer $70b_2$ is smaller than that in the second layer $70b_1$. Accordingly, this first additional layer $70b_2$ shows a function to prevent the Zn diffusion from the second layer $70b_1$.

A method to manufacture the optical device 1B will be described as referring to FIGS. 6A to 6F, which are cross sections showing the process for the device 1B.

Formation of Blocking Region

The blocking region 70B of the present embodiment may be formed as follows:

(1) growing the n-type first layer $70a_1$ so as to cover the substrate 10 and both sides of the mesa 2B, the first layer 70a doping the n-type impurities by a concentration greater than the Zn concentration in the first additional layer $70b_2$ and smaller than the Zn concentration in the second layer $70b_1$, for instance, the concentration of the n-type impurities in the first layer $70a_1$ being preferably between 0.4~0.8×$10^{18}$ cm$^{-3}$;

(2) growing the p-type first additional layer $70b_2$ on the first layer $70a_1$, where the first additional layer $70b_2$ is doped with Zn whose concentration is smaller than that in the second layer $70b_1$ (FIG. 6B);

(3) growing the second layer $70b_1$ on the first additional layer $70b_2$ (FIG. 6C);

(4) growing the n-type third layer 70c on the second layer $70b_1$ (FIG. 6D); and (5) growing the p-type fourth layer 70d on the third layer 70c to complete the blocking region 70B on the substrate 10.

In these layers, the p-type impurities contained is Zn, while, the n-type impurities is, for example, Si. These layers are sequentially grown by the OMVPE technique.

The striped insulating mask 60a is removed after the completion of the blocking region 70B. The process to form the device 1B has similar to or same with those explained accompanying with the first embodiment except for the formation of the blocking region 70B.

In the process for the second device 1B described above, the formation of the blocking region 70B, the upper cladding layer 40b and the contact layer 800 are carried out for one hour at a temperature between 620 to 680° C., which concurrently performs the heat treatment of the device. The first layer $70a_1$ may be converted into the p-type layer by the Zn diffusion from the second layer $70b_1$ during this heat treatment FIG. 6F shows the doping profile of the blocking region 70B taken along the line X-X' in FIG. 6E. The impurity concentration in the n-type first layer $70a_1$ exceeds the Zn concentration in the first additional layer $70b_2$. Thus, the first layer $70a_1$ may securely trap the Zn impurities diffused from the additional layer into the active layer 30.

The doping concentration in the n-type first layer $70a_1$ is smaller than the Zn concentration in the second layer $70b_1$, which enables to convert the conduction type of the n-type first layer $70a_1$ into the p-type by the Zn impurities diffused from the second layer $70b_1$, which makes the first layer $70a_1$ high-resistive to suppress the leak current occurred at the side walls of the mesa 2B.

Thus, the device in the second embodiment provides the first additional layer $70b_2$ between the n-type first layer $70a_1$ and the p-type second layer. Moreover, the doping concentration of Zn in this additional layer is smaller than the Zn concentration in the second layer $70b_1$, which enables the first additional layer $70b_2$ to operate as a buffer layer for the Zn diffusion from the second layer $70b_1$ to the active layer 30 in the mesa 2B.

The n-type first layer $70a_1$, similar to the first embodiment, may be converted into the p-type during the heat treatment of the layer growing process, and this first layer $70a_1$, the first additional layer $70b_2$ and the second layer $70b_1$ collectively operate as a p-type layer, which realizes the p-n-p configuration in the blocking region and prevents the current from flowing in the blocking region 70B.

Third Embodiment

Figure 7:
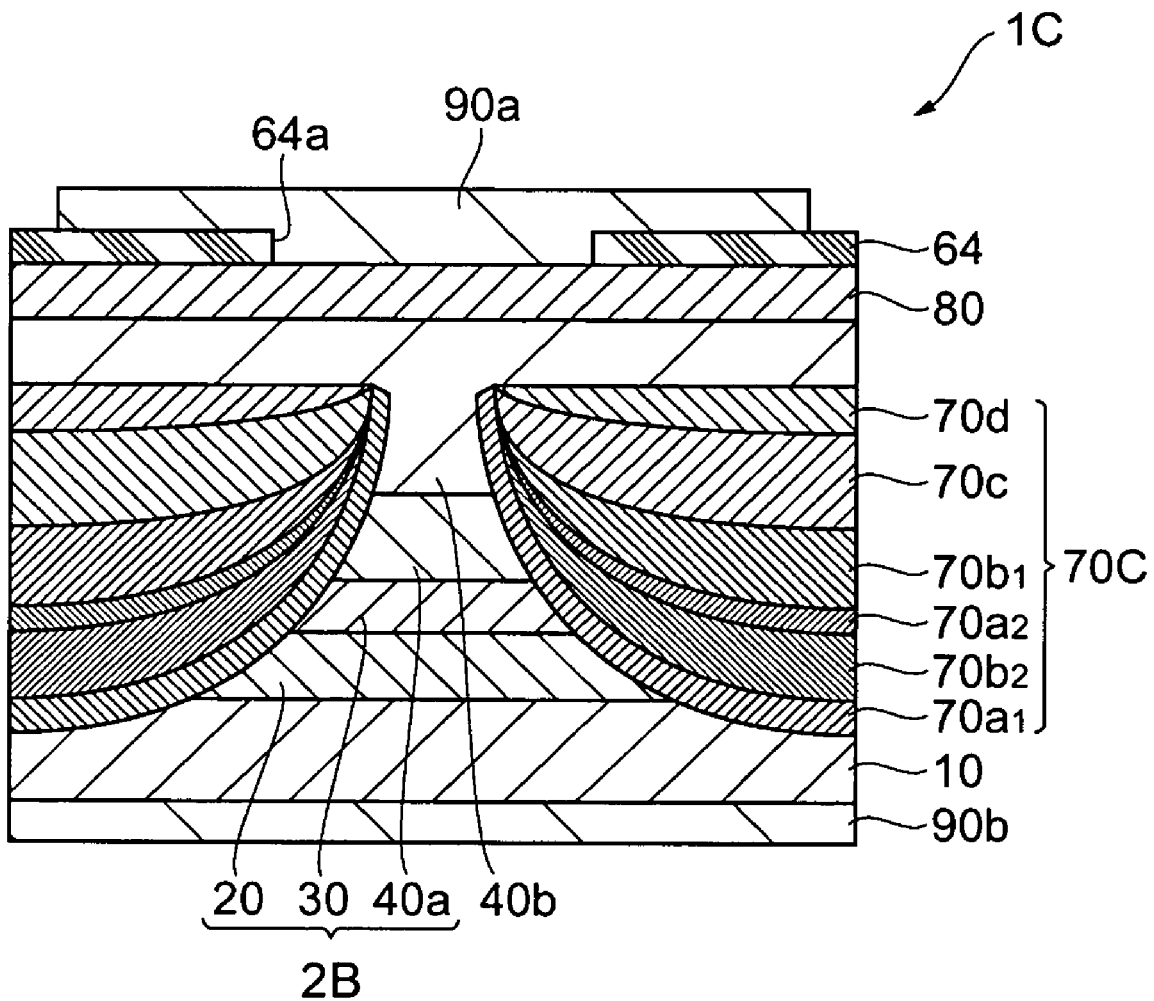
FIG. 7 schematically shows a cross section of a semiconductor optical device according to the third embodiment of the invention, where the blocking region includes, in addition to those shown in FIG. 6, a first additional layer $70b_2$ between the first layer $70a_1$, and the second additional layer $70a_2$.

FIG. 7 schematically illustrates a cross section of an optical device 1C according to the third embodiment of the invention. The device 1C may be directed to be a semiconductor laser diode. The device 1C has a feature, compared to former devices, to have another blocking region 70C. Other arrangements of the third device are similar to or same with those of the previous devices. The blocking region 70C provides further additional layer $70a_2$ between the second layer $70b_1$ and the first additional layer $70b_2$.

The table below lists the conditions of respective layers in the blocking region:

| Conditions of semiconductor layers V | |
| --- | --- |
| Layer | Conditions |
| first layer $70a_1$ | p-type InP<br>t: 0.1 μm |
| first additional layer $70b_2$ | p-type InP<br>[p]: 0.2~0.6 × $10^{18}$ cm$^{-3}$<br>t: 0.2 μm |
| second additional layer $70a_2$ | InP<br>[n]: 0.9~1.3 × $10^{18}$ cm$^{-3}$<br>[p]: 0.2~0.6 × $10^{18}$ cm$^{-3}$<br>t: 0.1 μm |
| second layer $70b_1$ | p-type InP<br>[p]: 0.7~1.1 × $10^{18}$ cm$^{-3}$<br>t: 0.6 μm |
| third layer $70c$ | n-type InP<br>[n]: 1.6~2.4 × $10^{18}$ cm$^{-3}$<br>t: 1.0 μm |
| fourth layer $70d$ | p-type InP<br>[p]: 0.7~1.1 × $10^{18}$ cm$^{-3}$<br>t: 0.1 μm |

The second additional layer $70a_2$, as listed in the table above, is made of InP dopes with both n-type and p-type impurities. The doping concentration of the n-type impurities is preferably 0.9~1.3×$10^{18}$ cm$^{-3}$, while, that of the p-type impurities is preferably 0.2~0.6×$10^{18}$ cm$^{-3}$. The thickness of the second additional layer $70a_2$ is preferably 0.1 μm. This second additional layer $70a_2$ may dope only the n-type impurities.

This second additional layer $70a_2$ may trap the Zn impurities diffused from the second layer $70b_1$ to the active layer 30 in the mesa 2B.

Figure 8A:
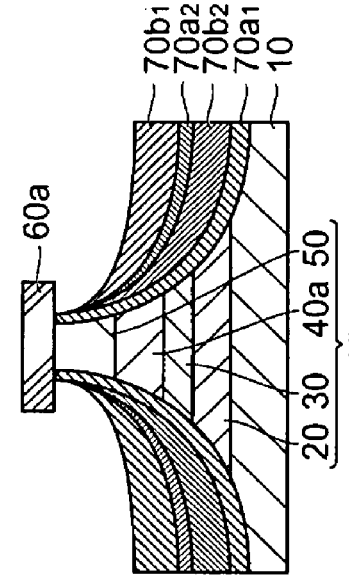
FIGS. 8A to 8F show processes to form the blocking region shown in FIG. 7.
Figure 8D:
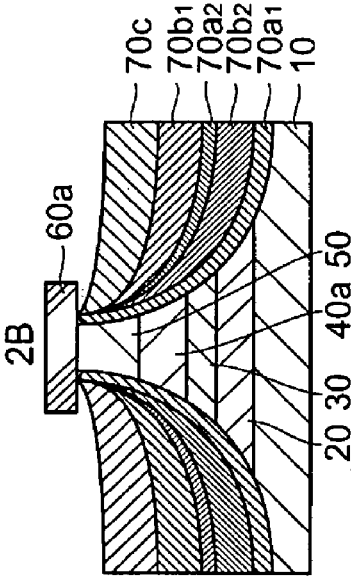
Figure 8B:
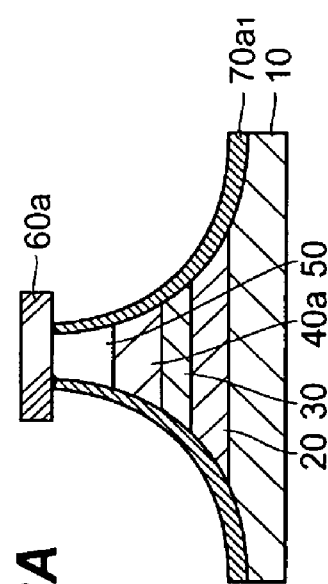
Figure 8E:
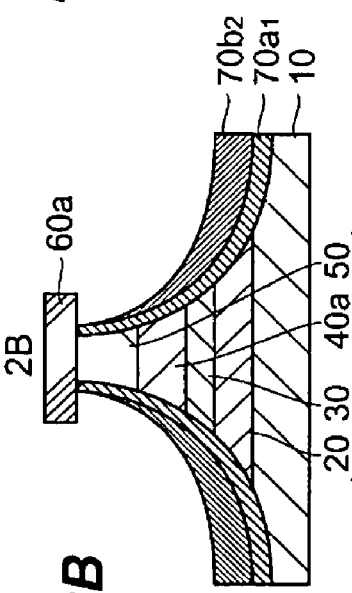
Figure 8C:
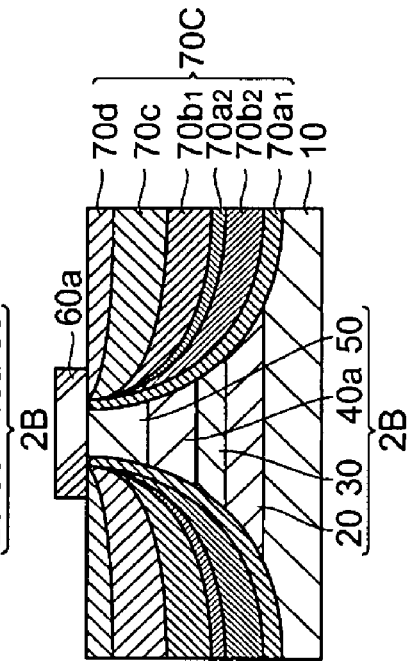
Figure 8F:
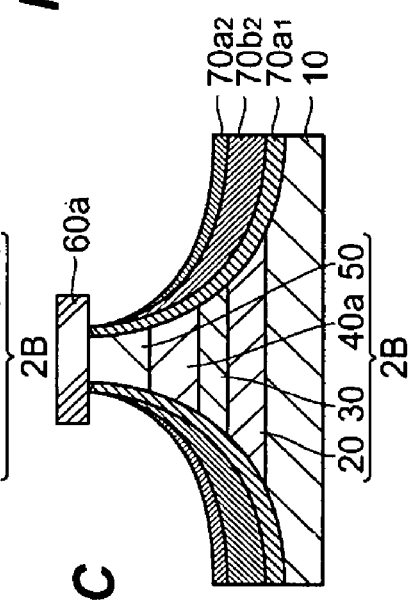
Figure 9:
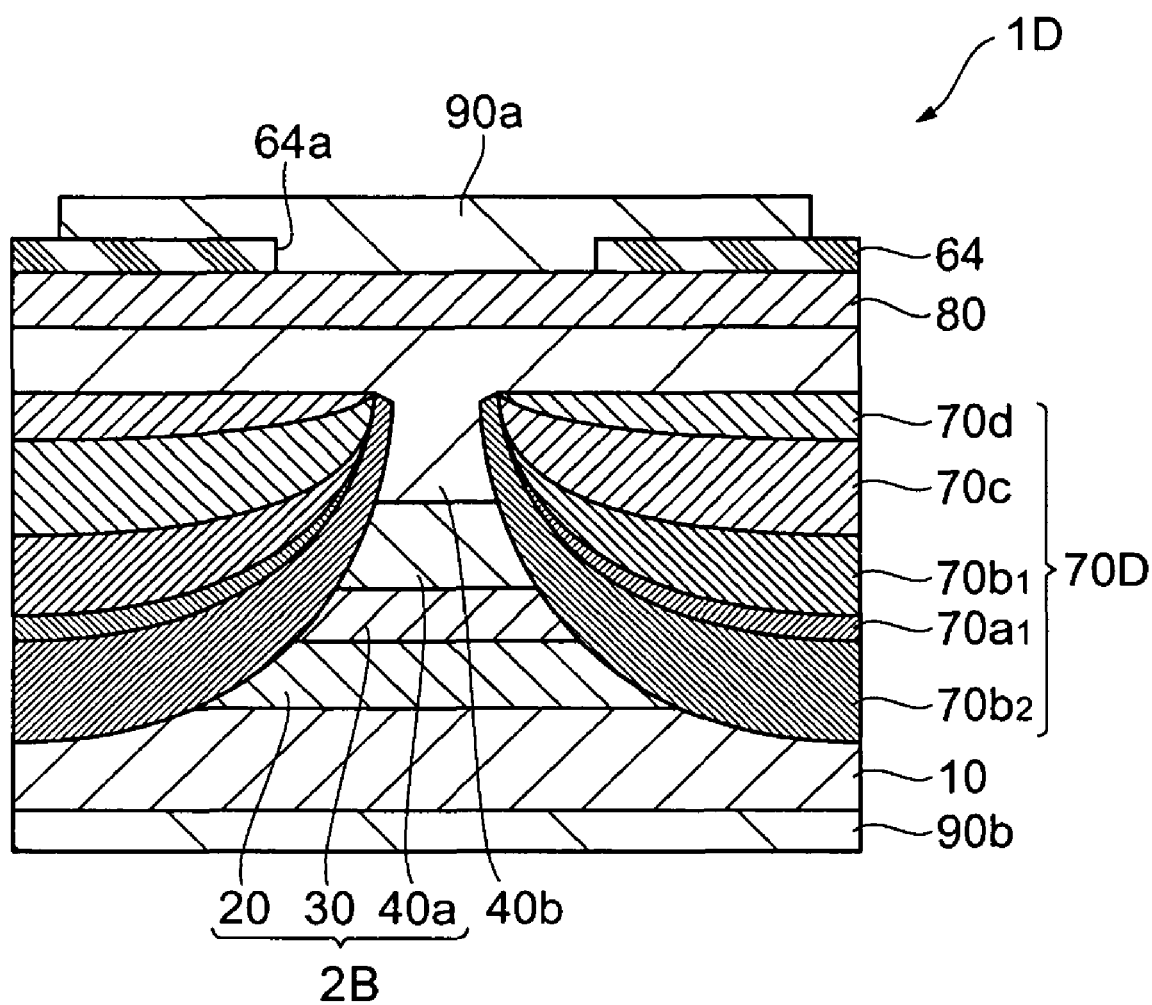
FIG. 9 schematically shows a cross section of a semiconductor optical device according to the fourth embodiment of the invention, where the blocking region includes the first and second additional layers, $70b_2$ and $70a_2$, but the additional layer $70b_2$ is provided between the first layer $70a_1$ and the mesa.

Next, a method to form the device 1C will be described as referring to FIGS. 8A to 11F, which schematically illustrate processes of the third optical device 1C. The blocking region 70C of this device may be formed by;

(1) growing the n-type first layer so as to cover the substrate 10 and the side walls of the mesa 2B, the doping concentration of the first layer being preferably 0.4 to 0.8×$10^{18}$ cm$^{-3}$ (FIG. 8A);

(2) growing the first additional layer $70b_2$ on the first layer $70a_1$ (FIG. 8B);

(3) growing the p-type second additional layer $70a_2$ on the first additional layer $70b_2$ (FIG. 8C);

(4) growing the p-type second layer $70b_1$ on the second additional layer $70a_2$ (FIG. 8D);

(5) growing the third layer $70c$ on the second layer $70b_1$ (FIG. 8E); and (6) growing the fourth layer $70d$ on the third layer $70c$ (FIG. 8F). Thus, the blocking region 70C may be formed in both sides of the mesa 2B on the substrate 10. The p-type impurities applied in those layers may be Zn, while, the n-type impurities may be Si, and the growth may be carried out by the OMVPE technique.

After the growth of the blocking region 70C, the striped insulating mask 60a is removed. Other processes except for growth of the blocking region 70C are similar to or same with those applied in the previous device.

Also in the present process to form the optical device 1C, the blocking region 70C, the upper cladding layer 40b and the contact layer 80 are grown at a high temperature of 620~680° C. for one hour, which concurrently performs the heat treatment of the device. However, the first layer $70a_1$ and the second additional layer $70a_2$ may be converted to the p-type by the Zn diffusion from the first additional layer $70b_2$ and the second layer $70b_1$, respectively.

Thus, according to the optical device 1C, the second additional layer $70a_2$ between the second layer $70b_1$ and the first additional layer $70b_2$ may trap the Zn impurities diffusing from the second layer $70b_1$ to the active layer 30 in the mesa 2B, which may also enhance the long-term reliability of the optical device 1C.

Moreover, this second additional layer $70a_2$ may be converted into the p-type layer during the subsequent thermal process, accordingly, the first layer $70a_1$, the first additional layer $70b_2$, the second additional layer, and the second layer $70b_1$ may collectively operate as a p-type layer to configure the p-n-p arrangement in the blocking region 70C.

Fourth Embodiment

FIG. 12 schematically illustrates across section of an optical device 1D according to the fourth embodiment of the invention. This device 1D may be also a laser diode and provides a blocking region 70D instead of that 1A appeared in the first embodiment. Other arrangements except for the blocking region 70D are similar to or same with those of the first embodiment. The blocking region 70D of the device 1D provides an additional layer $70b_2$ between the first layer $70a_1$ and the mesa 2B not the second layer $70b_1$.

The table below lists the conditions of layers in the blocking region at portion extending substantially in parallel to the substrate 10:

| Conditions of semiconductor layers VI | |
| --- | --- |
| Layer | Conditions |
| additional layer $70b_2$ | p-type InP<br>[p]: 0.2~0.6 × $10^{18}$ cm$^{-3}$<br>t: 0.2 μm |
| first layer $70a_1$ | p-type InP<br>t: 0.1 μm |
| second layer $70b_1$ | p-type InP<br>[p]: 0.7~1.1 × $10^{18}$ cm$^{-3}$<br>t: 0.7 μm |

-continued

Conditions of semiconductor layers VI

| Layer | Conditions |
|---|---|
| third layer 70c | n-type InP<br>[n]: 1.6~2.4 × 10$^{18}$ cm$^{-3}$<br>t: 1.0 μm |
| fourth layer 70d | p-type InP<br>[p]: 0.7~1.1 × 10$^{18}$ cm$^{-3}$<br>t: 0.1 μm |

The additional layer $70b_2$ is made of p-type InP doped with Zn by a concentration of 0.2~0.6×10$^{18}$ cm$^{-3}$ and a thickness of 0.2 μm.

That is, the doping concentration of the n-type impurity in the first layer $70a_1$ is larger than the doping concentration of the p-type impurity, typically Zn, in the second layer $70b_1$, which effectively traps the Zn atoms diffusing from the second layer $70b_1$ to the active layer 30 in the mesa 2B. Further, the doping concentration of the p-type impurity, Zn, in the additional layer $70b_2$ is smaller than that in the second layer $70b_1$, which makes the additional layer to be a buffer layer for the Zn diffusion from the second layer $70b_1$.

Next, a method to manufacture the device 1D shown in FIG. 12 will be described as referring to FIGS. 13A to 13F that schematically illustrate the cross section at respective steps. The blocking region 70D of the present embodiment may be formed by the sequential growth of the layers by the OMVPE technique, that is:

(1) growing the additional layer $70b_2$ so as to cover the substrate and both side walls of the mesa 2B, the additional layer being doped with Zn by a concentration smaller than that in the second layer (FIG. 10A);

(2) growing the first layer $70a_1$ on the additional layer $70b_2$, the first layer being doped with the n-type impurities whose concentration is greater than the doping concentration of Zn in the second layer, for example, the concentration of the n-type impurities in the first layer preferably being 0.9~1.310$^{18}$ cm$^{-3}$ (FIG. 10B);

(3) growing the second layer $70b_1$ on the first layer $70a_1$ (FIG. 10C);

(4) growing the third layer 70c on the second layer $70b_1$ (FIG. 10D);

(5) growing the fourth layer 70d on the third layer 70c.

In the process mentioned above, the p-type impurity in the layers above may be Zn, while, the n-type impurity may be Si. Thus, the blocking region 70D may be formed in both sides of the mesa 2B and on the substrate 10. After the completion of the growth of the blocking region 70D, the process removes the striped insulating mask 60a.

The growth of the blocking region 70D, the upper cladding layer 40b and the contact layer 80 are carried out in a high temperature between 620° C. and 680° C. for one hour, which concurrently performs a heat treatment of the device 1D. During this heat treatment, the first layer $70a_1$ may be converted into the p-type layer by the Zn diffusion from the second layer $70b_1$.

FIG. 10F schematically illustrates a doping profiles in the blocking region taken along the line XIIIf-XIIIf in FIG. 10E. The concentration of the n-type impurity in the first layer $70a_1$ exceeds the doping concentration of the p-type impurity in the second layer $70b_1$, where the first layer $70a_1$ may effectively trap the Zn impurities diffusing from the second layer $70b_1$ into the active layer 30 in the mesa 2B.

The device 1D of the fourth embodiment provides the p-type additional layer $70b_2$ so as to bury the mesa 2B. Generally, a configuration where the mesa is surrounded by the n-type layer increases the leak current at the side walls of the mesa 2B. However, the device 1D provides the p-type additional layer $70b_2$ coming in contact with the side walls of the mesa 2B, which effectively suppresses the leak current occurred at the side walls.

Moreover, similar to the previous embodiments, the first layer $70a_1$ may be converted into the p-type layer during the subsequent thermal process. Then, the first layer $70a_1$, the additional layer $70b_2$ and the second layer $70b_1$ collectively operate as a p-type layer, which realizes the p-n-p configuration in the blocking region 70D to prevent the current from flowing therein.

When the semiconductor devices, 1A to 1D, are biased such that the top electrode 90a becomes positive with respect to the other electrode 90b, holes are injected from the upper electrode 90a into the active layer 30 through the window 64b. The injected carriers are confined in the mesa 2B almost not flowing in the blocking regions, 70A to 70D. Thus confined carries may recombine with electrons provided from the lower electrode 90b to generate light in the active layer 30.

While the preferred embodiments of the present invention have been described in detail above, many changes to these embodiments may be made without departing from the true scope and teachings of the present invention. For instance, the semiconductor devices, !a to 1D, may be an LED and a laser diode with the surface emitting configuration whose active layer has a quantum wire structure or a quantum dot structure. The active layer 30, not restricted to the multiple quantum well structure, may be a bulk structure or a single quantum well structure. Moreover, the blocking regions, 70A to 70D, may increase or decrease the number of their lamination. The thickness of the first layer $70a_1$ and the second additional layer $70a_2$ in the blocking region may be variable as long as the layer is converted into the p-type layer by the Zn diffusion during the subsequent thermal process.

The additional layer $70b_2$ may be un-doped InP although the embodiments above adopts the p-type InP whose Zn concentration is smaller than that in the second layer $70b_1$. In this configuration, the additional layer $70b_2$ may perform a function of the buffer for the Zn diffusion from the second layer $70b_1$.

The substrate 10 in all embodiments above is the n-type, however, the substrate may be the p-type. In this case, the lower cladding layer is also p-type, while, the upper cladding layers, 40a and 50b, the cap layer 50 and the contact layer 80 are necessary to be n-type.

Moreover, all embodiments above mentioned convert the conduction type of the first layer $70a_1$ by the thermal process of the growth of the blocking region, 70A to 70D, the upper cladding layer 40b and the contact layer 80. However, the heat treatment after the completion of the process may convert the conduction type of the first layer 70a, into the p-type.

What is claimed is:

1. A method for manufacturing a semiconductor optical device, comprising steps of:
   forming a mesa on a semiconductor substrate, said mesa including a lower cladding layer, an active layer, and an upper cladding layer;

forming a blocking region so as to bury said mesa by a sequential growth including:

growing a first semiconductor layer made of InP doped with n-type impurities at least on a side wall of said active layer in said mesa, growing a second semiconductor layer on said first semiconductor layer, said second semiconductor layer being made of p-type InP doped with zinc (Zn), and growing a third semiconductor layer made of n-Type InP doped with n-type impurities; and converting said first semiconductor layer into a p-type semiconductor layer by heat treatment.

2. The method according to claim 1,
wherein a doping concentration of said n-type impurities in said first semiconductor layer is greater than a doping concentration of Zn in said second semiconductor layer.

3. The method according to claim 2,
further comprising a step for forming a first additional semiconductor layer made of p-type InP doped with Zn after said step for forming said first semiconductor layer before said step for forming said second semiconductor layer.

4. The method according to claim 3,
wherein said doping concentration of said n-type impurities in said first semiconductor layer is greater than a doping concentration of said Zn in said first additional semiconductor layer.

5. The method according to claim 3,
wherein a doping concentration of said Zn in said first additional semiconductor layer is smaller than said doping concentration of Zn in said second semiconductor layer.

6. The method according to claim 5,
further comprising a step for forming a second additional semiconductor layer made of n-type InP after said step for forming said first additional semiconductor layer before said step for forming said second semiconductor layer, said second additional semiconductor layer being converted into a p-type semiconductor layer by said heat treatment.

7. The method according to claim 2,
further comprising a step for forming a first additional semiconductor layer made of un-doped InP after said step for forming said first semiconductor layer before said step for forming said second semiconductor layer.

8. The method according to claim 7,
further comprising a step for forming a second additional semiconductor layer made of n-type InP after said step for forming said first additional semiconductor layer before said step for forming said second semiconductor layer, said second additional semiconductor layer being converted into a p-type semiconductor layer by said heat treatment.

9. A method for manufacturing a semiconductor optical device, comprising steps of:

forming a mesa on a semiconductor substrate, said mesa including a lower cladding layer, an active layer, and an upper cladding layer;

forming a blocking region so as to bury said mesa by a sequential growth including:

growing a first additional semiconductor layer made of InP doped with zinc (Zn), growing a first semiconductor layer made of InP doped with n-type impurities at least on a side wall of said active layer in said mesa, growing a second semiconductor layer on said first semiconductor layer, said second semiconductor layer being made of p-type InP doped with zinc (Zn), and growing a third semiconductor layer made of n-Type InP doped with n-type impurities; and converting said first semiconductor layer into a p-type semiconductor layer by heat treatment.

10. The method according to claim 9,
wherein a doping concentration of Zn atoms in said first additional semiconductor layer is lower than a doping concentration of Zn atoms in said second semiconductor layer.

11. The method according to claim 10,
wherein a doping concentration of said n-type impurities in said first semiconductor layer is higher than a doping concentration of Zn atoms in said second semiconductor layer.

* * * * *